Feb. 12, 1957 L. D. ARMSTRONG 2,781,481

SEMICONDUCTORS AND METHODS OF MAKING SAME

Filed June 2, 1952

INVENTOR
Lorne D. Armstrong
BY Morris L. Rabkin
ATTORNEY

United States Patent Office 2,781,481

Patented Feb. 12, 1957

2,781,481

SEMICONDUCTORS AND METHODS OF MAKING SAME

Lorne D. Armstrong, Princeton, N. J., assignor to Radio Corporation of America, a corporation of Delaware Application June 2, 1952, Serial No. 291,355

14 Claims. (Cl. 317—239)

Figure 1:
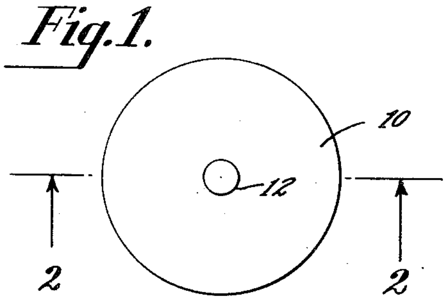

This invention relates to semiconductor devices and methods of making same. More particularly, the invention relates to semiconductor devices and methods of making them by diffusing an element which, as an impurity in semiconductor materials of one conductivity type, gives the semiconductor materials conductivity characteristics of an opposite type.

As used herein, the terms P-type conductivity, and N-type conductivity refer to the conductivity characteristics of semiconductor materials only. By a P-type or N-type conductivity impurity is meant an element which, when diffused into a semiconductor material, will cause the semiconductor material to exhibit conductivity characteristics of the type by which the impurity is designated.

The techniques of making semiconductor devices by alloying and diffusing an impurity of one conductivity type into a semiconductor material of an opposite conductivity type are well known in the art. Indium, for example, is an acceptor, or P-type impurity in germanium exhibiting N-type conductivity and may be introduced into the germanium so as to form a rectifying P–N junction therein. If uniformity of results is to be obtained in the manufacture of a plurality of semiconductor devices, it is important to control the size, shape and position of the P–N junction made by such combined alloying and diffusing of the P-type impurity, indium, into the germanium showing N-type conductivity. The simple application of a small piece of indium material on the surface of germanium, and the subsequent heating to produce alloying and diffusion produces a P–N junction whose size, shape and position varies from unit to unit, and whose location on the surface may be somewhat indeterminate. To more clearly define the P–N junction area, it has been proposed to electroplate the indium onto the germanium but a smooth layer of any thickness greater than a few microns is not readily obtained. The indium tends to agglomerate when melted and the area of the germanium finally coated is not the original area that was sought to be electroplated.

It is, therefore, a general object of the present invention to provide an improved semiconductor device having a P–N junction of desired, predetermined size, shape and position, and an improved method of producing the P–N junction.

Another object of this invention is to provide an improved process of diffusing a P-type conductivity impurity into an N-type conductivity semiconductor material whereby the size, shape and position of a P–N junction formed may be controlled.

A further object of the present invention is to provide an improved method of diffusing an impurity of one conductivity type into a semiconductor material exhibiting an opposite type conductivity by employing a metal plated on the semiconductor material to control the wetting of the semiconductor by the impurity.

A still further object of the present invention is to provide an improved method of diffusing an impurity of one conductivity type into a semiconductor material of an opposite conductivity type by retarding the diffusion process and thus providing an additional parameter of the temperature and time of the customary alloying and diffusion process.

Another object of the present invention is to provide an improved method whereby indium may be diffused into germanium of N-type conductivity in order to produce a P–N junction of desired size, shape and position.

According to the present invention these and other objects and advantages are attained by an improved process wherein a semiconductor material of one conductivity type is plated with a thin layer of a metal which alloys readily with an impurity of the opposite conductivity type and which does not subsequently affect the P–N junction of the semiconductor device formed. The plated area may be accurately controlled in size, shape and position by the customary techniques well known in the plating art.

In one embodiment of the invention, a P-type impurity, indium, is placed on a gold plated area of desired size on the surface of a wafer of N-type conductivity germanium. The indium is placed within the boundary of the gold plated area and the whole heated to melt the indium. The molten indium flows freely on the gold plated region only and forms an alloy with the gold. With further heating, diffusion of the indium into the germanium takes place through the intermediate gold layer, forming the desired P–N junction with a well defined area. Very satisfactory semiconductor devices in the form of junction rectifiers and transistors have been made by this method by using common metals which are easily plated on the semiconductor material and which are easily wetted by the impurity to be infused therein to form the P–N junction.

Figure 2:
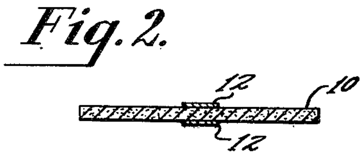
Figure 3:
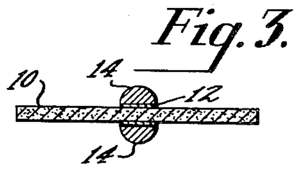
Figure 4:
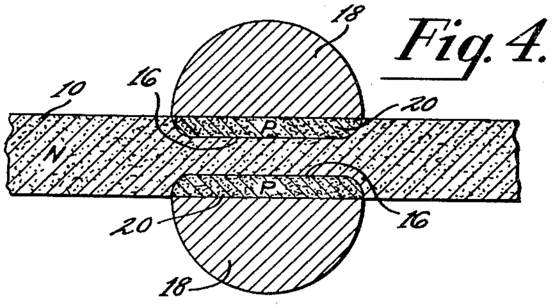

For a better understanding of the present invention, reference is had to the following description taken in connection with the accompanying drawing in which Fig. 1 is a plan view of a thin wafer of a semiconductor material having a small portion of its surface plated with a metal, in accordance with the present invention, Fig. 2 is a cross-sectional view of the device of Fig. 1 taken along the line 2—2, Fig. 3 is a cross-sectional view similar to Fig. 2 showing the impurity to be diffused into the semiconductor material mounted on the plated area, and, Fig. 4 is an enlarged cross-sectional view of a portion of the semiconductor material after the impurity has alloyed and diffused therein to form the P–N junction.

The improved method of the present invention will be described in connection with the manufacture of a junction transistor. Referring now to Fig. 1, there is shown a wafer 10 of N-type conductivity germanium. The wafer 10 has a resistivity of 2–5 ohm-cm., and has been cut from a single crystal of N-type conductivity germanium and ground to a thickness of approximately 0.10″. The wafer 10 has been etched with an acid solution containing nitric acid, hydrofluoric acid, and distilled water in the ratio of 5:5:1 to a final thickness of about .005″, and washed thoroughly in warm water of about 60° C. The wafer 10 may be etched by any other suitable etching means well known in the art. The wafer 10 is then mounted in a plating jig, or masked, and a desired area of the surface of the wafer 10 is plated with a metal 12. The metal 12 may be any metal that can be easily plated on the wafer 10, and one that will not affect the P–N junction to be formed by the introduction of a P-type impurity into the germanium. The metal 12 should also be one that is easily alloyable with the P-type impurity to be introduced into the germanium. The metal 12 may be gold, copper, silver, or nickel, for example, where the P-type impurity, indium, is to be diffused into the N-type conductivity germanium. Particularly satisfactory results have been obtained with gold as the plated metal 12. Although good junctions have been made with layers of the metal 12 up to two mils in thickness, the best thickness is considerably thinner than this, in the order of about 200 angstrom units. It is noted that the shape and size of the metal 12 will determine the shape and size of the P–N junction that will be formed in the transistor. Where a P–N junction is desired on both sides of the germanium wafer 10, the metal 12 is plated on both sides of the wafer 10, as shown in Fig. 2. After the plating process, the wafer 10 is cleaned by washing in warm water, acetone, and then dried. The thicknesses of the metal layers 12 in Figs. 2 and 3 are exaggerated for the purpose of illustration.

In order to introduce the P-type indium 14 into the N-type conductivity germanium, the wafer 10 is placed in a furnace, an appropriate amount of indium 14 is placed within the boundary of the upper plated metal 12 and the whole heated to about 350° C. for about one minute in a dry hydrogen atmosphere. The amount of indium used is determined by the area of the plated metal 12 to be covered. The wafer 10 is then turned over and another piece of the indium 14, is placed on the other plated metal 12 of the wafer 10 and the whole is then fired to about 450° C. for about 20 minutes. During the last-mentioned step, the indium 14 has formed an alloy with the gold layer 12. The wafer 10 is now etched by dipping the portion having the indium-gold alloy on it into a solution made of equal parts of nitric acid, hydrofluoric acid and distilled water for about 30 seconds, and then washed in running warm water, and dried.

In order to form a transistor having well defined barrier, or P–N junction 16 between the P-type impurity and the N-type conductivity germanium, the wafer 10, containing the indium-gold alloy 18 thereon, is reheated in an oxygen-free atmosphere, such as dried hydrogen or helium, at about 500° C. for about 20 minutes. The wafer 10 is then re-etched in a solution made up of equal parts of nitric acid, hydrofluoric acid and distilled water for about 30 seconds, washed in running warm water, and dried. The last step of reheating causes the indium to diffuse slowly into the N-type conductivity germanium to form a P-type conductivity layer 20 separated from the N-type conductivity germanium by a well defined P–N junction 16. Experimental evidence indicates that the presence of the small amount of plated metal 12 affects the relative solubility of the indium in the N-type conductivity germanium. The diffusion of the indium into the germanium is apparently retarded by the layer of metal 12. The temperatures used for diffusion of the indium into the germanium may be raised as much as 50 percent above those used in prior art alloying and diffusing methods without detrimental alloying effects. The retardation of the alloying by the plated metal 12 creates new possibilities in the formation of P–N junctions by diffusion. The P-type conductivity layer 20, thus formed, is extremely narrow but is shown with exaggerated thickness in Fig. 4 for the purpose of illustration.

Rectification characteristics of 1/32" diameter junctions made in accordance with the above described process exhibit about a one ampere forward current at one volt and only a few microamperes back current at the same voltage. The A. C. impedance in the reverse direction at 1–2 volts is as high as 10 megohms in these units. Transistors made with a junction on each side of the wafer 10, as shown in Fig. 4, have forward junction currents limited substantially by the base resistance only.

It is readily seen from the above described process that if a semiconductor device containing only one rectifying barrier 16 is desired, as for example, a junction rectifier, the metal 12 is plated on only one side of the germanium wafer 10. It is also obvious to those skilled in the art that the method of the present invention may be used to diffuse N-type impurities into P-type conductivity semiconductor materials.

Thus it is seen that there has been provided methods of forming P–N junctions in semiconductor materials of one conductivity by the alloying and the diffusion of impurities of an opposite type therein. P–N junctions with desirable characteristics have been made by the diffusion of a P–type conductivity impurity, indium, through an intermediate metal layer plated on N-type conductivity germanium. The intermediate metal is chosen so as to be more easily wetted by the impurities than is the germanium itself. The intermediate metal is substantially free from P-type and N-type impurities and is easily alloyable with the impurities to be diffused into the germanium. The size, shape and position of the P–N junctions are controlled by masking the germanium during the plating process so that only a well defined, predetermined area of the germanium is plated.

The semiconductor devices produced by the method of the present invention form excellent junction rectifiers and transistors having controlled characteristics which can be easily reproduced, if necessary.

While the process in accordance with the present invention has been shown and described in connection with the manufacture of a junction transistor for the purpose of illustration, it is obvious that changes could be made therein without departing from the scope and spirit of the invention. Therefore, the foregoing description is to be considered as illustrative and not in a limiting sense.

What is claimed is:

1. A method of treating a wafer of N-type conductivity germanium to introduce a layer of opposite conductivity type therein comprising plating a predetermined area on the surface of said wafer with a metal selected from the group consisting of gold, silver, copper and nickel, placing an indium pellet as a conductivity type-determining impurity on the metal plated area, heating said wafer and said indium pellet at about 450° C. for about 20 minutes in an atmosphere of hydrogen, etching the surface of said wafer containing the indium pellet, reheating said wafer and said indium pellet at about 500° C. for about 20 minutes in an atmosphere of hydrogen, and re-etching the surface of said wafer containing the indium pellet.

2. A method as defined in claim 1 wherein said metal is plated to a thickness of between 100 angstrom units to 2 mils.

3. A method as defined in claim 1 wherein said metal is plated to a thickness of 200 angstrom units.

4. A method as defined in claim 1 wherein said etching and re-etching is for a period of about 30 seconds with a solution made of equal parts of nitric acid, hydrofluoric acid and distilled water.

5. A method of making a semiconductor device by the introduction of an indium pellet into a wafer of N-type conductivity germanium comprising etching both sides of said wafer, plating a predetermined area on both sides of said wafer with a metal selected from the group consisting of gold, silver, copper and nickel, placing an indium pellet on the metal plated area on one side of said wafer, heating said wafer and impurity at about 350° C. for about 1 minute in a hydrogen atmosphere, turning said wafer over and placing another indium pellet on the other metal plated area, heating said wafer and said pellet at about 450° C. for about 20 minutes in a hydrogen atmosphere, etching said wafer and pellet, reheating said wafer and said pellet at about 500° C. for about 20 minutes, and re-etching said wafer and said pellet.

6. A method of making a semiconductor device as defined in claim 5 wherein said first-mentioned etching is with a solution of nitric acid, hydrofluoric acid and distilled water in the ratio of 5:5:1 until said wafer is etched from a thickness of .010" to .005".

7. A method of making a semiconductor device as defined in claim 5 wherein said metal plating is about 200 angstrom units thick.

8. A method of making a semiconductor device as defined in claim 5 wherein said semiconductor material comprises N-type conductivity germanium, said impurity comprises indium, and said plated metal has a thickness of between 100 angstrom units and 2 mils.

9. A method of making a semiconductor device as defined in claim 5 wherein said last-mentioned etching and re-etching is with a solution of equal parts of nitric acid, hydrofluoric acid and distilled water for about 30 seconds.

10. The process of making a semiconductor device having a P–N junction therein by the introduction of a P-type conductivity impurity into N-type conductivity germanium comprising etching a wafer of N-type conductivity germanium, washing the wafer in hot water, plating a predetermined area on the surface of said wafer with a metal selected from the group consisting of gold, silver, copper and nickel, washing the plated wafer in hot water and in acetone, drying the plated wafer, placing a pellet of indium on the plated area of the wafer, heating the wafer and impurity at about 450° C. for about 20 minutes in a dried hydrogen atmosphere, etching said wafer and said indium pellet, washing said wafer and indium pellet in hot water, drying said wafer and impurity, reheating said wafer and indium pellet at about 500° C. for about 20 minutes in a dried hydrogen atmosphere, re-etching said wafer and impurity, washing said wafer and indium pellet in hot water, and drying said wafer and indium pellet.

11. A process of making a semiconductor device as defined in claim 10 wherein said first-mentioned etching is with a solution of nitric acid, hydrofluoric acid and distilled water in the ratio of 5:5:1, said plated metal is plated on said wafer to a thickness of from 100 angstrom units to 2 mils, and said last-mentioned etching and re-etching is with a solution of equal parts of nitric acid, hydrofluoric acid, and distilled water for 30 seconds.

12. A method of making a semi-conductor device comprising plating a surface of a semi-conductor body of N-type conductivity germanium with a layer of a metal selected from the class consisting of gold, silver, copper and nickel, and thereafter alloying an indium pellet through said layer and into said body, thereby to form a P–N rectifying junction within said body.

13. In a method of alloying an impurity material capable of imparting conductivity characteristics of one type to a body of semi-conductive material of opposite conductivity type in order to form a P–N junction within said body, the steps comprising plating a predetermined area on the surface of an N-type conductivity germanium body with a metal which is selected from the class consisting of gold, silver, copper and nickel, and thereafter alloying a quantity of indium through said plated area and into said body thereby to form said P–N junction.

14. A semiconductor device comprising a wafer of N-type semiconductive germanium, a metallic electrode fused to a surface of said wafer, and a P–N rectifying junction disposed in said wafer adjacent to said electrode, said electrode consisting essentially of indium in which are dissolved minor proportions of germanium and a metal from the group consisting of gold, silver, copper and nickel.

References Cited in the file of this patent

UNITED STATES PATENTS

| | | |
|---|---|---|
| 2,300,400 | Axline | Nov. 3, 1942 |
| 2,428,992 | Ransley | Oct. 14, 1947 |
| 2,449,484 | Jaffe | Sept. 14, 1948 |
| 2,530,110 | Woodyard | Nov. 14, 1950 |
| 2,561,411 | Pfann | July 24, 1951 |
| 2,589,658 | Bardeen | Mar. 18, 1952 |
| 2,597,028 | Pfann | May 20, 1952 |
| 2,602,763 | Scaff et al. | July 8, 1952 |
| 2,623,102 | Shockley | Dec. 23, 1952 |

FOREIGN PATENTS

| | | |
|---|---|---|
| 428,855 | Great Britain | May 21, 1935 |

OTHER REFERENCES

Ser. No. 368,502, Nachtigall (A. P. C.), published May 11, 1943.

Physical Review, vol. 86, pages 136 and 137, May 1, 1952.